US008598875B2

(12) United States Patent
Abele et al.

(10) Patent No.: US 8,598,875 B2
(45) Date of Patent: Dec. 3, 2013

(54) MRI APPARATUS WITH OFFSET IMAGING VOLUME

(75) Inventors: Manlio Abele, New York, NY (US); Vincenzo Punzo, S. Giorgio a Cremano (IT); Alessandro Trequattrini, Genoa (IT); Stefano Pittaluga, Genoa (IT); Stefano Besio, Genoa (IT)

(73) Assignee: ESAOTE S.p.A., Genoa (IT)

( * ) Notice: Subject to any disclaimer, the term of this patent is extended or adjusted under 35 U.S.C. 154(b) by 570 days.

(21) Appl. No.: 12/844,227

(22) Filed: Jul. 27, 2010

(65) Prior Publication Data

US 2011/0025332 A1 Feb. 3, 2011

(30) Foreign Application Priority Data

Jul. 28, 2009 (IT) .............................. GE2009A0059

(51) Int. Cl.
*G01V 3/00* (2006.01)
(52) U.S. Cl.
USPC ......................................................... 324/309
(58) Field of Classification Search
USPC .................................................. 324/300–322
See application file for complete search history.

(56) References Cited

U.S. PATENT DOCUMENTS

| | | | |
|---|---|---|---|
| 4,689,591 A | | 8/1987 | McDougall |
| 5,581,185 A | * | 12/1996 | Petropoulos et al. ......... 324/318 |
| 5,646,532 A | | 7/1997 | Knuttel et al. |
| 6,252,402 B1 | | 6/2001 | Sanfilippo et al. |
| 6,600,318 B1 | | 7/2003 | Kakugawa et al. |
| 7,193,417 B2 | | 3/2007 | Forbes et al. |
| 2007/0035298 A1 | | 2/2007 | Pittaluga et al. |

FOREIGN PATENT DOCUMENTS

| | | |
|---|---|---|
| EP | 0187691 A2 | 7/1986 |
| EP | 0940686 A1 | 9/1999 |
| EP | 1748300 A1 | 1/2007 |
| JP | 60-183706 A | 9/1985 |
| JP | 2004-41715 A | 2/2004 |
| JP | 2005-118098 A | 5/2005 |

OTHER PUBLICATIONS

Italian Search Report dated Mar. 11, 2010 for IT GE20090059.
Written Opinion for IT GE20090059.
Huawei Zhao et al., Asymmetric MRI Magnet Design using a Hybrid Numerical Method, Journal of Magnetic Resonance 141, 340-346, 1999.

* cited by examiner

*Primary Examiner* — Dixomara Vargas
(74) *Attorney, Agent, or Firm* — Buchanan Ingersoll & Rooney PC

(57) ABSTRACT

An MRI apparatus having a magnet structure which delimits a cavity for receiving a body under examination or a part thereof, which includes a mechanism for generating a magnetic field in the cavity, as well as a mechanism for causing the body under examination or the part thereof to emit nuclear magnetic resonance signals, a region defined in the cavity, known as an imaging volume, and a mechanism for receiving the nuclear magnetic resonance signals. The geometric center of the geometric shape of the cavity delimited by the magnet structure is offset in relation to the geometric center of the imaging volume.

16 Claims, 9 Drawing Sheets

MRI APPARATUS WITH OFFSET IMAGING VOLUME

TECHNICAL FIELD

The present invention relates to an MRI apparatus comprising a magnet structure which delimits a cavity for receiving a body under examination or a part thereof, and which includes means for generating a magnetic field in said cavity, as well as means for causing the body under examination or the part thereof to emit nuclear magnetic resonance signals, a region being defined in said cavity, known as imaging volume, and means for receiving said nuclear magnetic resonance signals;

the apparatus of the present invention further comprises an electronic processing unit with which said means for receiving the nuclear magnetic resonance signals are electrically connected.

Said cavity has at least one opening through which a body under examination or a part of said body may access said cavity, and said imaging volume is a region of the interior space of said cavity, whose volume is smaller than the overall cavity volume, a static magnetic field of predetermined homogeneity being generated by the magnet structure in said imaging volume, said imaging volume being also ideally delimited by a three-dimensional surface within which the static magnetic field has a predetermined homogeneity.

BACKGROUND

Two types of MRI apparatus are currently known in the art, differing both in cavity size and in the intensity of the static magnetic field applied for nuclear spin orientation. These two types of apparatus are known as "total body" or "dedicated" scanners.

"Total body" scanners are designed for examination of entire bodies and have a large size, required for receiving the whole body under examination, with magnetic fields of medium to high intensity, and magnet structures requiring complex, large and expensive cooling systems.

Dedicated scanners are smaller and of easier installation, due to their low space requirements and weight, and their imaging cavities are of a size adapted to receive and examine only certain parts or a body and only certain anatomic regions thereof: typically, in these scanners static magnetic fields are generated by permanent magnets.

Nevertheless, these dedicated scanners are still of relatively large size, considering that even a magnetic field of low-to-medium intensity requires a relatively large amount of magnetized material to reach said intensity levels, and the magnet structure requires a bearing structure and elements such as yokes and/or ferromagnetic, as needed. Therefore, their reduced cavity size, allowing limited use with certain parts of a body only, does not correspond to an equivalently reduced size of the magnet structure and the MRI apparatus.

Furthermore, such low-to-medium static magnetic field causes the apparatus to be more sensitive to external noise fields, because the signals emitted from the body under examination are of relatively low intensity.

In addition to the above mentioned size-related problem, prior art MRI apparatus are characterized by magnet structures symmetrical with respect to the center of their own magnetic cavity; such symmetry inevitably involves a symmetric configuration of the magnetic field generated within said structure, so that the geometric center of the geometric cavity coincides with the center of the imaging volume, which is, defined as the point in which the gradient of the magnetic field generated within said magnet structure has a zero value.

This configuration is particularly disadvantageous in many clinical applications, in which the region of interest does not coincide with the geometric center of the body part under examination that contains the region of interest: examples of these applications may be examinations of radiologically important body parts, such as the rachis or the wrist.

In view of these considerations, the need arises for a solution that allows the region of interest of the human body to be examined to fall within the imaging volume, without increasing the size of the magnet structure.

The invention fulfills the above objects by providing an MRI apparatus as described hereinbefore which, using simple and inexpensive arrangements, can offset the geometric center of the cavity delimited by the magnet structure to the geometric center of the imaging volume.

As described in document EP0187691, the term imaging volume designates a region in the space contained in the cavity, in which region the static magnetic field generated by the generating means has a given homogeneity within given tolerances.

Therefore, this volume portion contained in the cavity is delimited by a non material boundary surface, which is determined by the features of the magnetic field, that is generally provided as a volume of spheroidal shape, or any shape allowing determination of its geometric center.

Both the magnet structure of the present invention and prior art magnet structures have such a configuration that they delimit a patient receiving cavity with regular geometric shapes, in which a geometric center is easily determinable.

As a rule, as described in document EP0187691, this geometric shape is a cylindrical shape with base surfaces parallel to the static magnetic field generating means, consisting of magnetic pole pieces, and whose geometric center is a point on the axis that passes through the center of the base surfaces and is perpendicular thereto and equidistant from the magnetic pole pieces.

As a result, the offset of the imaging volume center relative to the geometric center of the cavity delimited by the magnet structure occurs in the direction of this axis, whereby the points that correspond to the center of the imaging volume and the geometric center of the cavity are aligned but not coincident.

SUMMARY

The invention achieves the above objects by providing an MRI apparatus comprising a magnet structure which delimits a cavity for receiving a body under examination or a part thereof, and which includes means for generating a magnetic field in said cavity, as well as means for causing the body under examination or the part thereof to emit nuclear magnetic resonance signals, a region being defined in said cavity, known as imaging volume, and means for receiving said nuclear magnetic resonance signals;

the apparatus of the present invention further comprises an electronic processing unit with which said means for receiving the nuclear magnetic resonance signals are electrically connected.

Said cavity has at least one opening through which a body under examination or a part of said body may access said cavity, and said imaging volume is a region of the interior space of said cavity, whose volume is smaller than the overall cavity volume, a static magnetic field of predetermined homogeneity being generated by the magnet structure in said imaging volume, said imaging volume being also ideally delimited by a three-dimensional surface within which the static magnetic field has said predetermined homogeneity, and wherein the geometric center of the geometric shape of the cavity delimited by said magnetic structure is in offset relation to the geometric center of the imaging volume.

Unlike prior art solutions, the MRI apparatus of the present invention provides an offset relation between the geometric center of the geometric shape of the cavity delimited by said magnet structure and the geometric center of the imaging volume, i.e. the point in which the magnetic field gradient is zero. Such offset relation may be preferably provided by an asymmetry of the magnetic field generated by said means for generating the magnetic field in said cavity, said asymmetry having the same direction as the offset.

As described in documents EP 0187691 and U.S. Pat. No. 6,600,318, the means for generating the static magnetic field in the cavity generally consist of two opposed magnetic pole pieces located at two opposite sides of the cavity, i.e. the horizontal sides, with reference to a typical MRI apparatus. Such magnetic pole pieces generate a magnetic field whose flux lines are perpendicular to the pole pieces and, as described in documents EP 0187691 and U.S. Pat. No. 6,600, 318, magnetic pole pieces that have different magnetic moments may create a vertical asymmetry in the magnetic field generated in the cavity, thereby creating a vertical offset of the imaging volume toward the pole piece with the lower magnetic moment.

It shall be noted that the magnetic field generated by the generating means is optimized in a portion of the volume contained in the cavity, to ensure homogeneity within given tolerances. Therefore, this volume portion contained in the cavity is delimited by a non material boundary surface, which is determined by the features of the magnetic field, that is generally provided as a volume of spheroidal shape, or any shape allowing determination of its geometric center.

This portion of volume is the volume defined as an ideal imaging volume, due to the absence of material boundary surfaces, with boundary surfaces being instead defined by the homogeneity characteristics of the geometric field.

Said magnetic field generating means may include at least two opposing magnetic pole pieces located at two opposite sides of the cavity, which magnetic pole pieces comprise at least one layer of magnetized material to generate a magnetic field oriented from one to the other of said two magnetic pole pieces, magnetic field flux returning means being provided at the two opposite sides of a section plane of the cavity which is oriented transverse, particularly perpendicular to the magnetic field.

Said at least two returning elements are magnetized with different magnetizations, to generate an offset of the geometric center of the imaging volume with respect to the geometric center of the geometric shape of the cavity delimited by said magnet structure.

Furthermore, said two magnetic pole pieces included in the magnetic field generating means of the inventive apparatus are preferably vertically aligned as upper and lower pole pieces, the lower pole piece possibly having patient support means associated therewith, which are mounted eccentrically to the axis that joins the centers of said two pole pieces, for easier positioning of the patient's body or part thereof, for instance during the examination steps; support means including, for instance, patient tables or housings for proper positioning of parts of the patient's body in said cavity.

Also, in a particular embodiment of the apparatus of the present invention, these support means allow accurate positioning of the part of the patient's body within the imaging volume, as said offset relation of the center of the imaging volume to the geometric center of the geometric shape of the cavity delimited by said magnet structure may be generated in the direction of and at a predetermined distance from the lower pole piece, i.e. in the direction of the pole piece with which said support means are associated.

A further improvement of the apparatus of the present invention contemplates the use of means for adjusting the magnetization of the at least two magnetic field flux returning elements so that the magnetization adjustment of these two elements may control the offset of the center of the imaging volume to the geometric center of the geometric shape of the cavity delimited by said magnet structure.

The offset of the imaging volume center relative to the geometric center of the geometric shape of the cavity, caused by the adjustment of the magnetization of the flux returning elements may generate magnetic field inhomogeneity in the imaging volume. Therefore, according to an improvement of the present invention, means are provided for fine adjustment of the magnetic field in the process known as shimming.

These fine adjustment means may consist of magnetic dipoles held within a locating and fixing plate, which is situated at least at one of the two magnetic pole pieces at the two opposite sides of the cavity.

Upon determination of the offset between the imaging volume center and the geometric center of the geometric shape delimited by the cavity, caused by the different magnetization of the magnetic field flux returning elements, the homogeneity of the magnetic field may be corrected by a shimming session, as is known in the art and/or particularly as disclosed in patents EP 1748300 and EP 0940686, by the applicant hereof.

Otherwise, these means for fine adjustment of magnetic field homogeneity may consist of a matrix of coils supplied with supply currents, instead of the dipoles as described above. These coils may be separately powered, with the supply currents being determined by the known algorithms of prior art shimming methods, which algorithms are possibly replaced by and/or combined with magnetic field measuring means.

According to an improvement of the present invention, the matrix of coils may be in the form of an electronic printed circuit board, where the coils are the tracks of the circuit, and are individually connected to multiple power sources.

This configuration provides considerable advantages because, in combination with the magnetic field measuring means and a supply current controller controlled by the algorithms of prior art shimming methods, it allows real time homogenization of the magnetic field, thereby allowing the characteristics of the magnetic field to be adjusted even during examination of the patient's body. Furthermore, the use of coils, either in a matrix of coils and in the form of a printed circuit board, allows shimming to be carried out with no direct mechanical dipole positioning, but in a simple automatic manner, for instance by managing separate power supply to each coil according to the algorithms of prior art shimming methods.

The possibility of adjusting the offset relation between the center of the imaging volume and the center of the shape of the magnet structure cavity is a particularly advantageous and efficient feature, as it allows optimized positioning of the imaging volume according to the type of body under examination, or part thereof, to be analyzed and/or to the type of examination and/or the characteristics of the desired image. Furthermore, this feature may be obtained, mainly but without limitation, using variable magnets, preferably electromagnets and superconducting magnets, or using means for controlling temperature within said magnetic field flux returning elements, which will act as parts of said means for adjusting the magnetization of said magnetic field flux returning elements.

In one embodiment of the MRI apparatus of the present invention said magnet structure has a C shape, with two horizontal arms and one vertical arm, said two horizontal arms being formed of said magnetic pole pieces, and the vertical arm being formed of said at least two magnetic field flux returning elements.

A further embodiment of the MRI apparatus of the present invention is characterized by a magnet structure that has a closed annular shape, with two horizontal or vertical arms carrying the magnetic pole pieces, which are connected at their opposite ends by transverse arms, that are formed of at least one pair of magnetic field flux returning elements.

In one preferred embodiment of the MRI apparatus of the present invention, said magnet structure has no ferromagnetic yoke for returning the magnetic field flux, and comprises one or more magnetized elements, such as, in a possible embodiment, uniformly magnetized prisms.

The use of such a magnet structure affords a static magnetic field of higher intensity within said cavity without changing the size of the magnet: such feature is particularly desirable in dedicated Magnetic Resonance Imaging scanners, where the cavity is not required to have a large size, but the static magnetic field is required to have a medium intensity.

BRIEF DESCRIPTION OF THE DRAWINGS

These and other features and advantages of the present invention will appear more clearly from the following description of a few embodiments, illustrated in the annexed drawings, in which.

DETAILED DESCRIPTION

Figure 1:
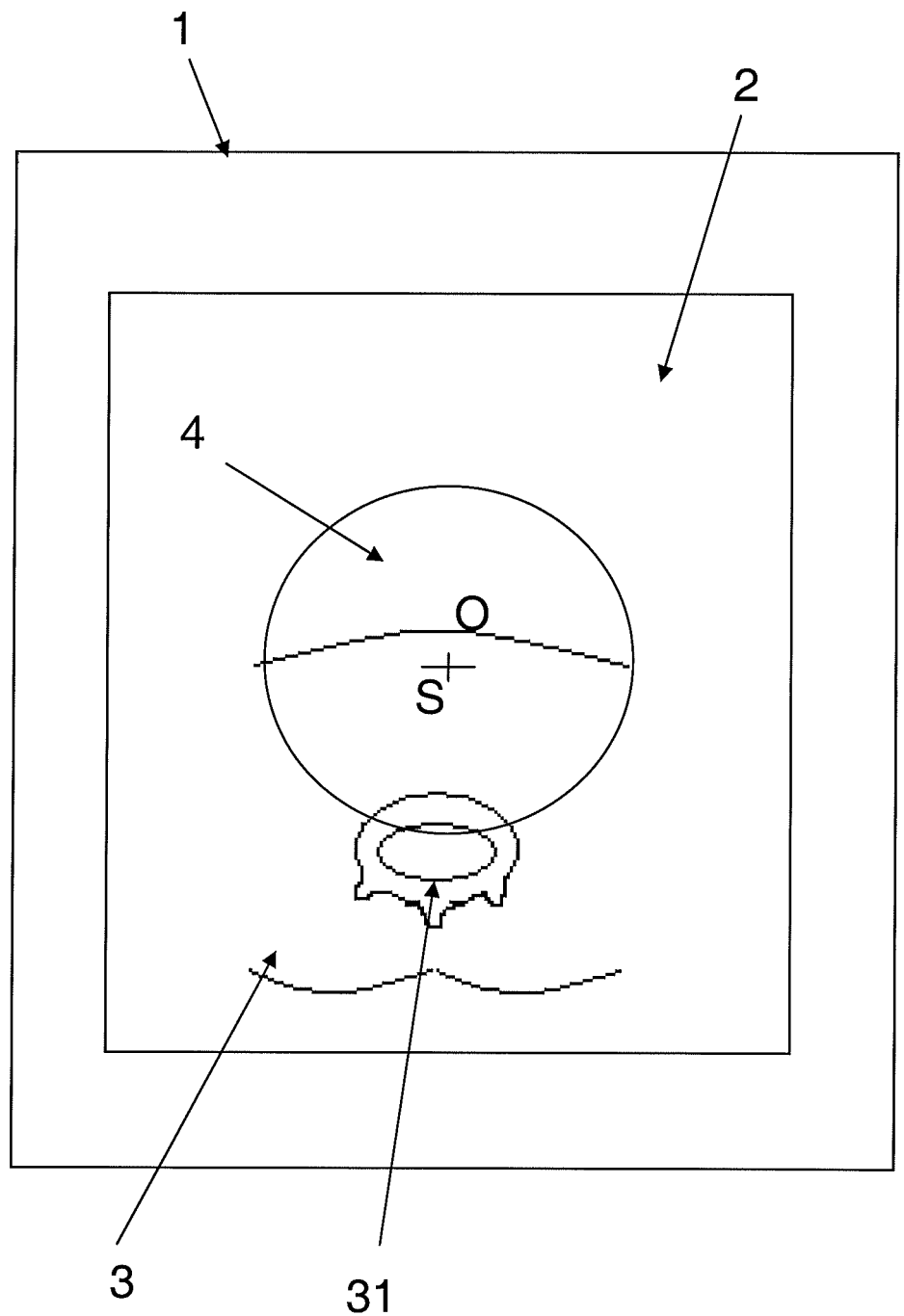
FIG. 1 shows a variant embodiment of magnet structures for prior art MRI apparatus.

Referring to FIG. 1, there is schematically shown one of the possible magnet structure configurations for prior art MRI apparatus, comprising a load-bearing magnet structure 1, here having an annular section, which delimits an internal cavity 2 for receiving at least part of the body of a patient 3, and further containing an imaging volume, usually of spherical shape, 4.

As shown in FIG. 1, these apparatus are characterized by magnet structures symmetrical with respect to the center O of their own magnetic cavity; such symmetry inevitably involves a symmetric configuration of the magnetic field generated within said structure, so that the geometric center O of the geometric cavity coincides with the center S of the imaging volume, which is defined as the point in which the gradient of the magnetic field generated within said magnet structure has a zero value. In the case illustrated in FIG. 1, in which the part of the patient's body under examination is a part of the rachis 31, it can be noted that the condition of coincidence of the geometric center S of the imaging volume with the geometric center O of the cavity, caused by the symmetric configuration, does not allow the region of interest of the body of the patient 3 to be totally included in the imaging volume.

Figure 2:
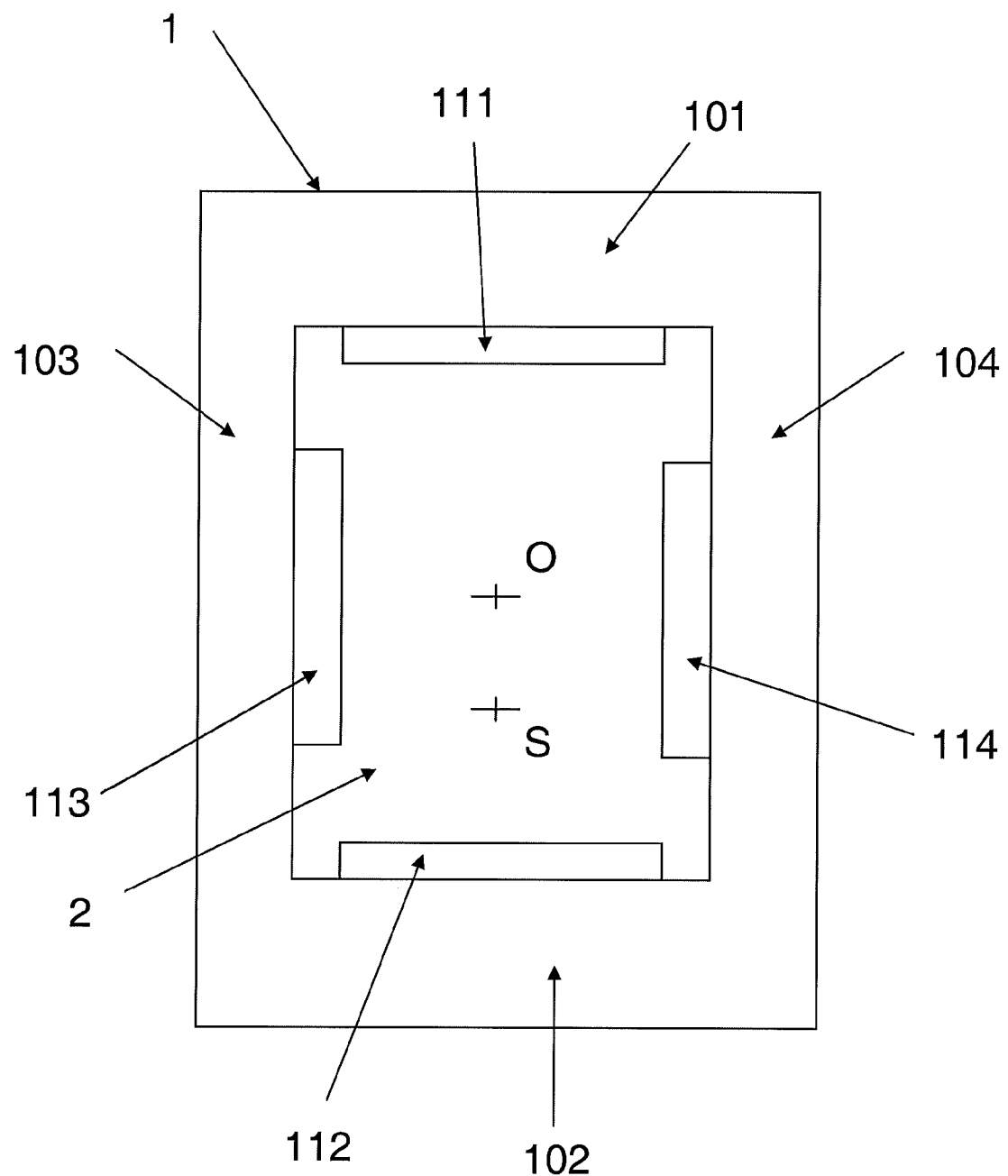
FIG. 2 shows a possible embodiment of the apparatus of the invention, with a magnet structure of annular cross section.

FIG. 2 shows a possible embodiment of the apparatus of the present invention, whose magnet structure has a closed annular cross section, comprising a load-bearing structure 1, which delimits a cavity 2 for receiving a body under examination or a part thereof, and which includes means for generating a magnetic field in said cavity 2, as well as means for causing the body under examination or part thereof to emit nuclear magnetic resonance signals, thereby generating an imaging volume 4 in said cavity 2.

Particularly, said magnetic field generating means include at least two opposing magnetic pole pieces 111 and 112 located at two opposite sides of the cavity 101 and 102, which magnetic pole pieces 111 and 112 comprise at least one layer of magnetized material to generate a magnetic field oriented from one to the other of said two magnetic pole pieces, magnetic field flux returning means 113 and 114 being provided at the two opposite sides 103 and 104 of the load-bearing structure 1.

Said cavity 2 has at least one opening through which a body under examination or a part of said body may access said cavity 2, and said imaging volume 4 is a region of the interior space of said cavity 2, whose volume is smaller than the overall cavity volume.

A static magnetic field of predetermined homogeneity is thus generated by the magnetic field generating pole pieces 111 and 112 within said imaging volume 4 centered at a point S.

Still referring to FIG. 2, a different magnetization of the two magnetic field flux returning elements 113 and 114 creates an asymmetry of the magnetic field being generated, thereby causing an offset between the geometric center O of the geometric shape of the cavity 2 delimited by the load-bearing structure 1 and the geometric center S of the imaging volume 4: particularly, in FIG. 2 the magnetic field generating pole pieces 111 and 112 are arranged in vertically aligned relationship, to form an upper pole piece 111 and a lower pole piece 112 and the two returning elements 113 and 114 have such a magnetization difference that the offset between the center O of the cavity 2 and the center S of the imaging volume 4 is generated in the direction of and at a predetermined distance from the lower pole piece 112.

Figure 3:
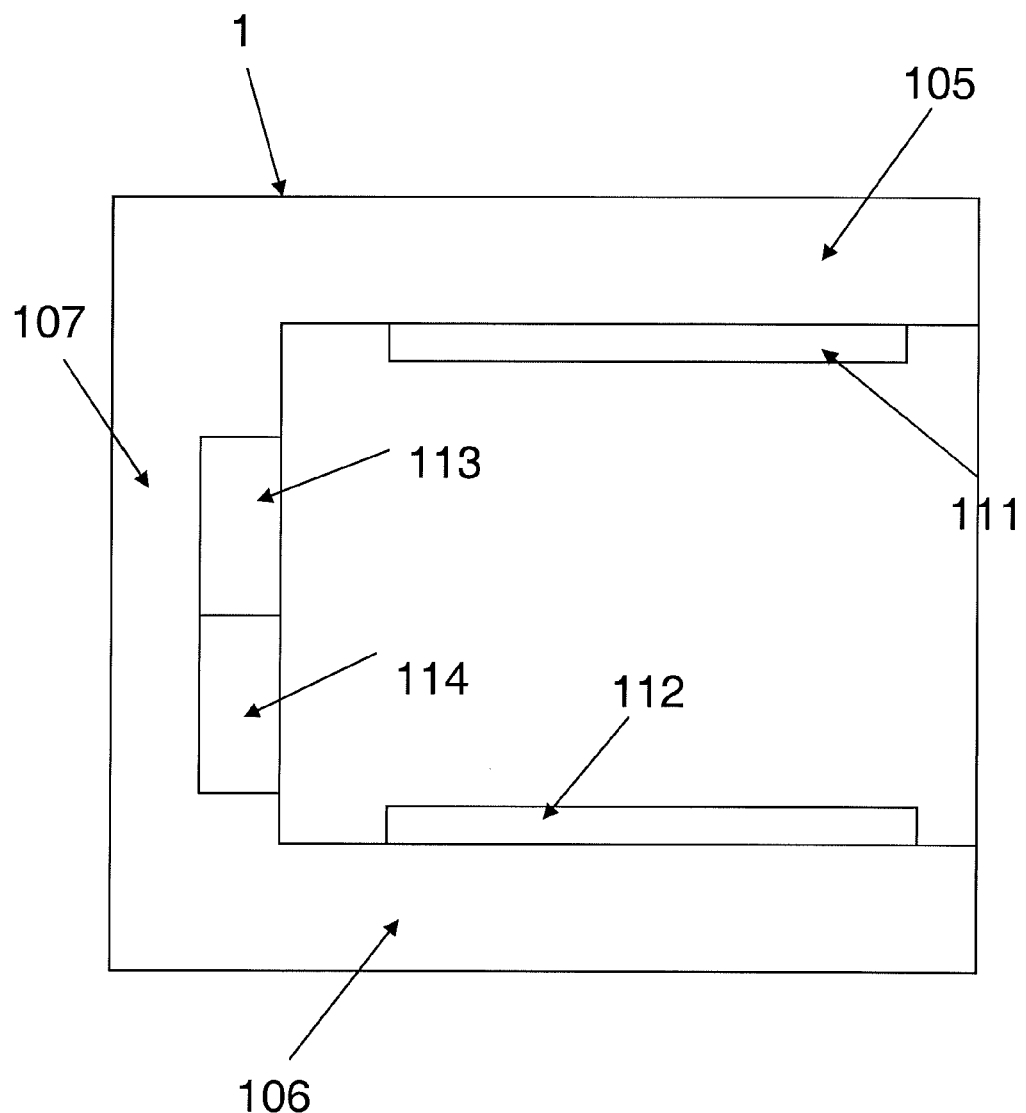
FIG. 3 shows another possible embodiment of the apparatus of the present invention, with a magnet structure of inverted U- or C-shaped cross section.

FIG. 3 shows a variant embodiment of the MRI apparatus of the present invention, which includes a magnet structure 1 of inverted U or C shape, having two horizontal arms 105 and 106 and one vertical arm 107; the two horizontal arms 105 and 106 are formed of the magnetic field generating pole pieces 111 and 112, whereas the vertical arm 107 is formed of the two magnetic field flux returning elements 113 and 114.

Further improvements may be envisaged with respect to the configurations illustrated in FIGS. 2 and 3, such improvements including, for instance, the installation of patient support means, such as patient tables or the like, associated with the lower pole piece 112, and disposed eccentrically to the axis that ideally joins the two pole pieces 111 and 112 for easier positioning of the patient's body or part thereof during the examination steps.

Magnetization adjustment means may be also associated with the magnetic flux returning means 113 and 114 illustrated in FIGS. 2 and 3, for adjusting the magnetization of said returning elements 113 and 114, to control the distance between the geometric center O of the cavity 2 and the center S of the imaging volume 4: in a possible embodiment, these magnetization adjustment means may be variable magnets, preferably electromagnets or superconducting magnets, or means for controlling temperature within said magnetic field flux returning elements.

The possibility of adjusting such distance allows the apparatus of the present invention to be highly adaptable to all types of examinations and/or bodies under examination and/or image characteristics.

Figure 4A:
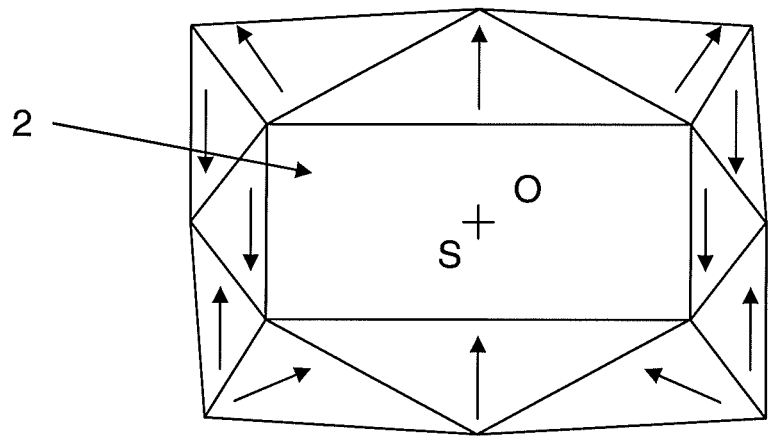
FIGS. 4a and 4b show a further embodiment of the MRI apparatus of the present invention, in which the magnet structure has no ferromagnetic yoke.
Figure 4B:
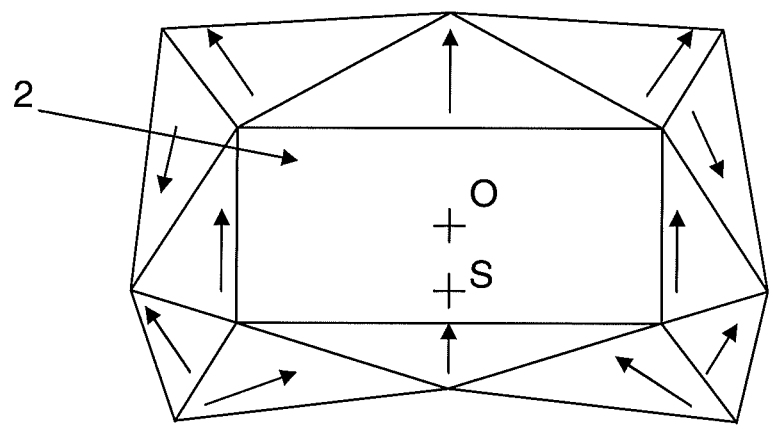

FIGS. 4a and 4b show an additional embodiment of the MRI apparatus of the present invention, in which the magnet structure has no ferromagnetic yoke, the magnet structure is formed of magnetized elements in the form of uniformly magnetized prisms, each of the latter having a residual magnetic flux vector J, which is designated by arrow elements within said prisms.

Particularly in FIG. 4a, these magnetized prisms have the same values for the residual magnetic flux vector J and the geometric center O of the geometric shape of the cavity 2 delimited by the magnet structure coincides with the geometric center of the imaging volume S.

Conversely, in FIG. 4b, the magnetized prisms 5 to 16 have different values for the residual magnetic flux vector J: this different magnetization leads to an offset of the geometric center O of the geometric shape of the cavity 2 delimited by the magnet structure with respect to the center of the imaging volume; particularly, in FIG. 4b such offset has the same direction as the magnetic field.

As explained above, such offset is particularly useful in many clinical applications, in which the body or body part to be examined is not symmetrical, hence a variant embodiment of the magnet structure as shown in FIG. 4b contemplates the use of the magnetization adjustment means as illustrated in FIG. 3, to adjust magnetization within the magnetized elements 5 to 16, for instance according to the position of the region of interest of the body or body part to be examined within the cavity 2.

Figure 5A:
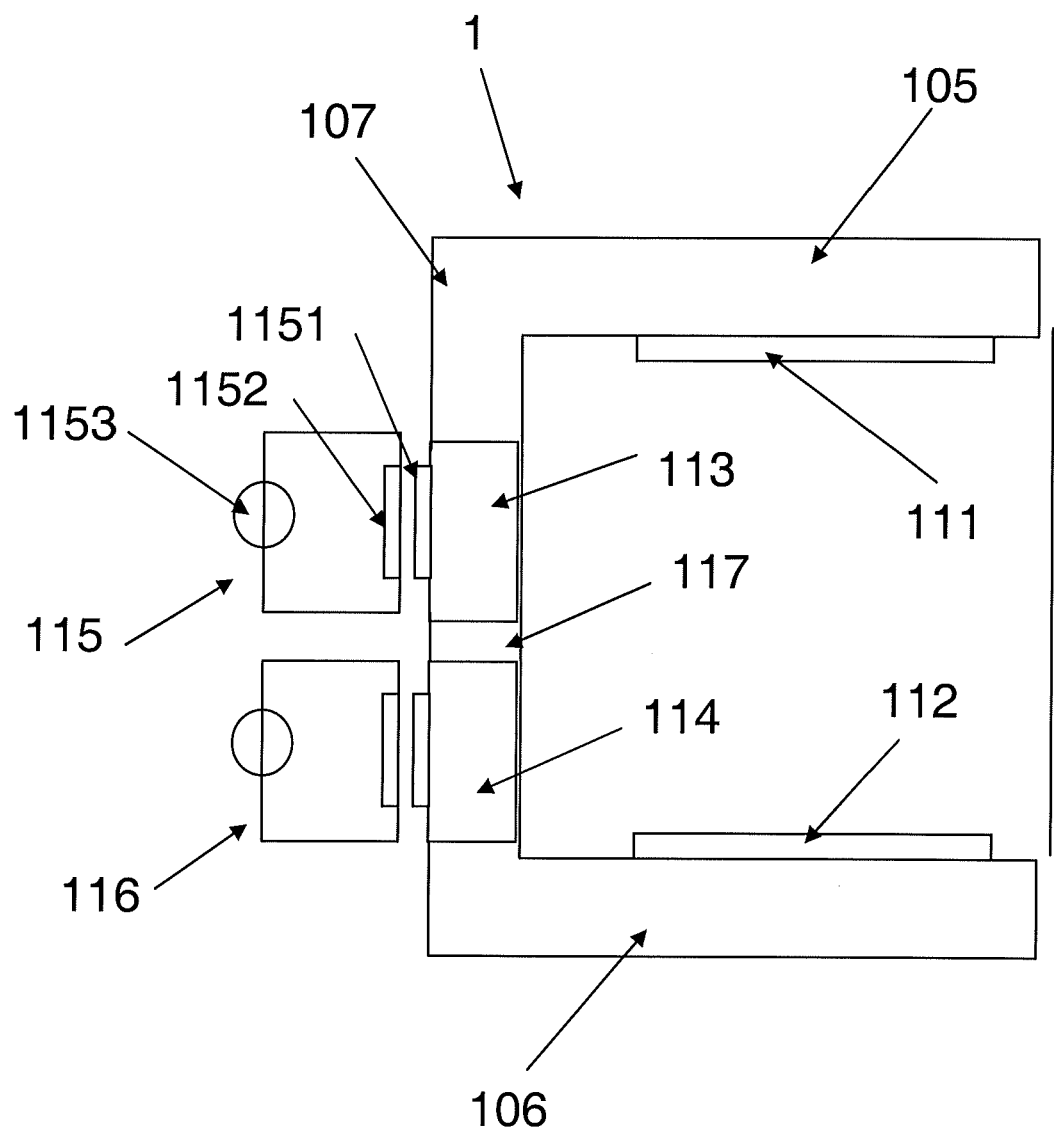
FIGS. 5a and 5b are general schematic views of the MRI apparatus according to two different embodiments.
Figure 5B:
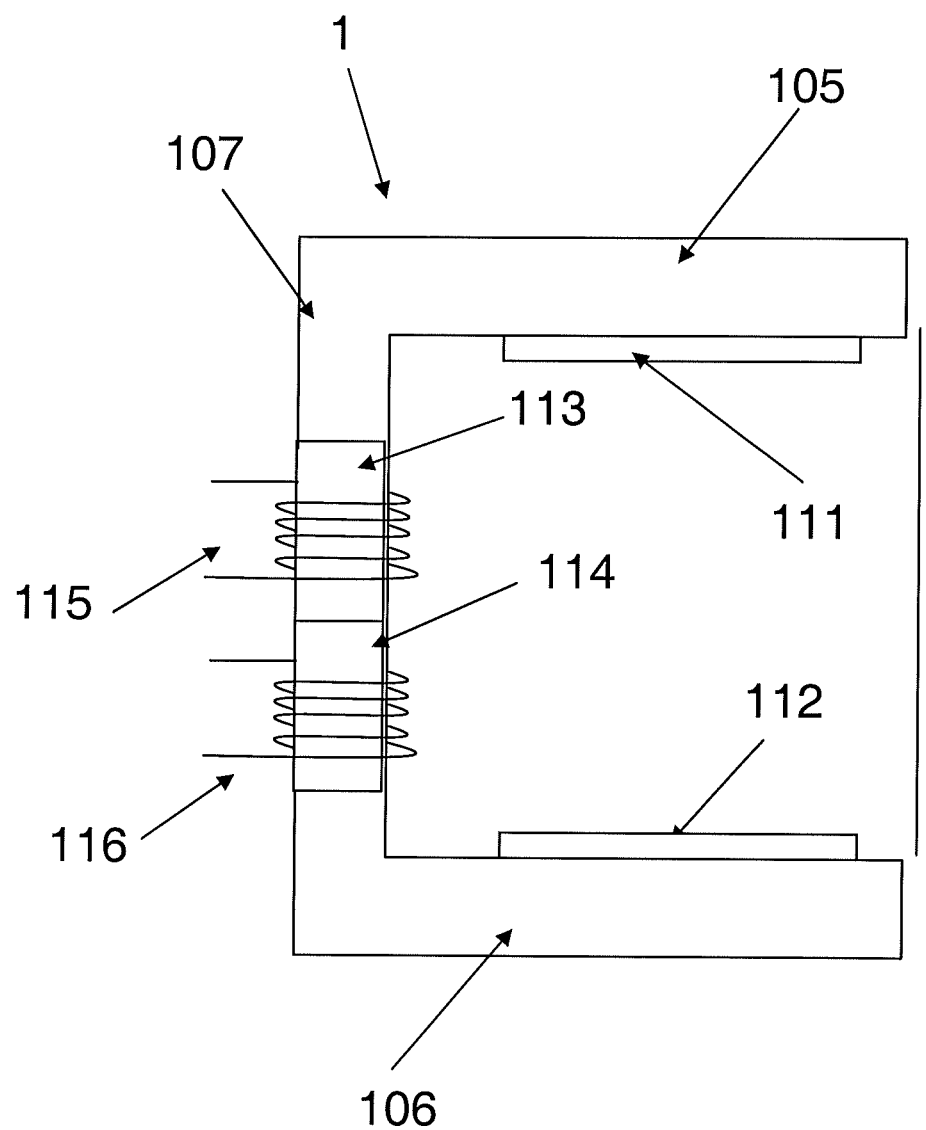

FIGS. 5a and 5b show two schematic views of two variant embodiments of the apparatus of the invention, in which the apparatus consists of a C-shaped load bearing structure having two horizontal arms 105 and 106 and a vertical arm 107 with a cavity 2 for receiving a body under examination. Means for generating a static magnetic field in said patient receiving cavity 2 are provided in the structure.

In these two examples, said generating means consist of at least one pair of permanent magnets 111 and 112 in spaced relation, so that the patient receiving cavity 2 is interposed between said permanent magnets 111 and 112, said permanent magnets being connected by the vertical arm 107 of the C-shaped load bearing structure 1.

The vertical arm 107 of the load bearing structure 1 consists of two returning elements 113 and 114 that are designed to return the magnetic field flux and hence affect the direction and intensity of the magnetic field in the cavity 2.

Particularly, if the two returning elements 113 and 114 have the same magnetization, the geometric center of the magnetic shape of the cavity 2 delimited by the load bearing structure 1 coincides with the center of the imaging volume. Otherwise, if the returning elements 113 and 114 have different magnetizations, such difference affects the magnetic field flux, i.e. changes the direction and intensity of the magnetic field.

Thus, the characteristics of the magnetic field may be changed by adjusting the magnetization of the returning elements 113 and 114.

Particularly referring to FIG. 5a, these elements include magnetization adjusting means 115 and 115, which consist of means for changing the temperature in the returning elements 113 and 114.

Each returning element 113 and 114 has a corresponding temperature changing means 115 and 116, for the two returning elements to have different temperature and for the temperature of each of them to be changed in an independent and differentiated manner.

Particularly, in FIG. 5a, these temperature changing means 115 and 116 consist of two thermoelectric Peltier cell devices. Each of the two Peltier cells is connected to a single magnetic field flux returning element 113, 114, and the two returning elements 113 and 114 are thermally insulated from each other by an insulating element 117.

Each Peltier cell consists of two junctions 1151 and 1152 connected to a control and adjustment power supply, that controls heat exchange between the two junctions 1151 and 1152. The Peltier cells are connected to the magnetic field flux returning elements 113 and 114, whereby the power supply 1153 to the cells can control temperature variation in the elements 113 and 115, thereby controlling the magnetization adjustment that causes the offset of the imaging volume center from the geometric center of the geometric shape delimited by the cavity.

FIG. 5b shows a further variant embodiment of the MRI apparatus of the present invention, in which the returning elements 113 and 114 consist of electromagnets, each individually supplied with supply currents that eventually adjust magnetization of the elements.

In this case, two coils 115 and 116 are provided, which are separately connected to two different power sources that generate different magnetic fields and this induce different magnetizations in the magnetic field flux returning elements 113 and 114.

As mentioned above, the different magnetizations of the elements 113 and 114 cause a perturbation of the static magnetic field generated in the cavity, which allows the center of the imaging volume to be offset from the geometric center of the geometric shape delimited by the cavity.

In both the above cases, a programmable controller may be provided, which changes either the temperature of the magnetization adjustment means 115 and 116 or the supply currents to the coils 115 and 116, thereby controlling magnetic field variation and, as a result, the offset of the imaging volume center from the geometric center of the geometric shape delimited by the cavity 2.

Figure 6:
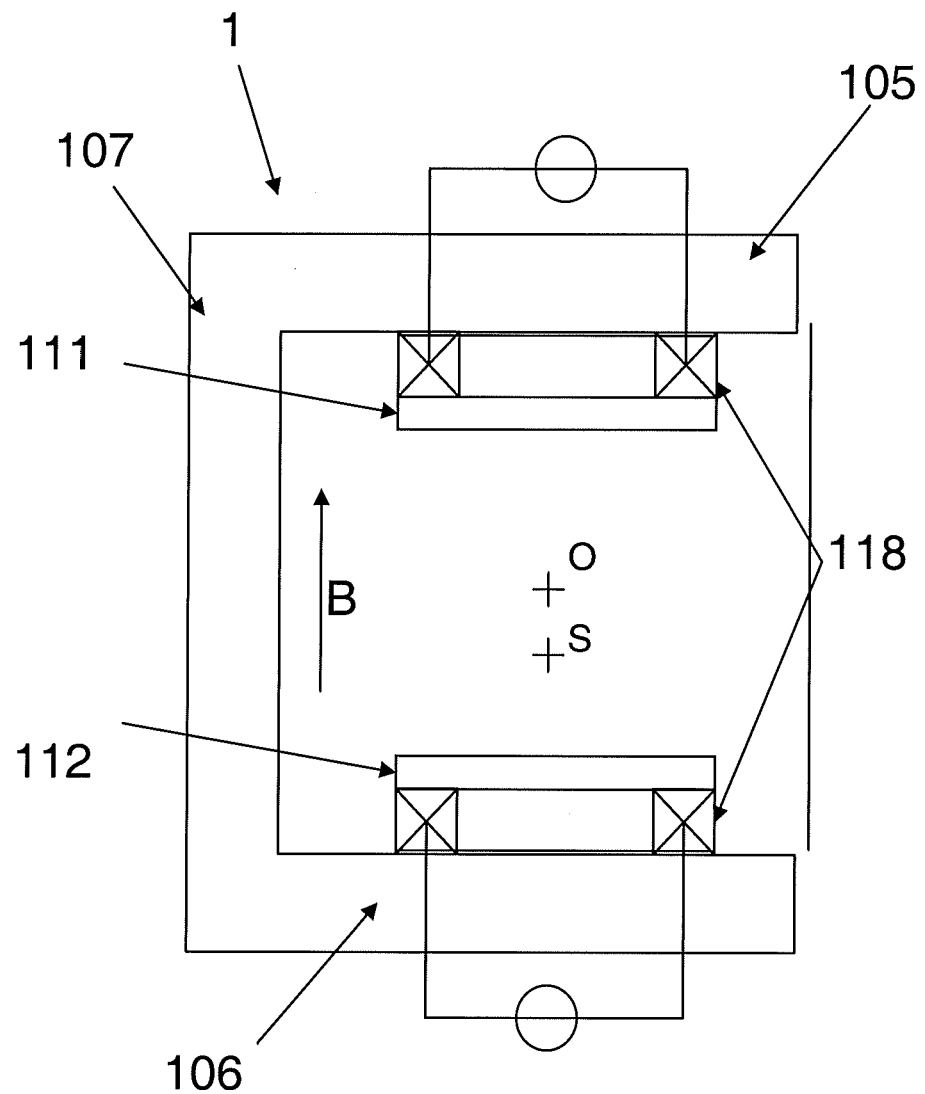
FIG. 6 is a general schematic view of the MRI apparatus according to a variant embodiment.

FIG. 6 shows a further embodiment of the MRI apparatus of the invention, in which the apparatus consists of a C-shaped load bearing structure having two horizontal arms 105 and 106 and a vertical arm 107 with a cavity 2 for receiving a body under examination. Means for generating a static magnetic field B in said patient receiving cavity 2 are provided in the structure.

Said generating means consist of at least one pair of permanent magnets 111 and 112 in spaced relation, so that the patient receiving cavity is interposed between said permanent magnets 111 and 112, said permanent magnets being connected by the vertical arm 107 of the C-shaped load bearing structure 1, and said permanent magnets being provided in combination with at least two coils.

Particularly referring to FIG. 6, the generating means include, in combination with the permanent magnets 111 and 112, a pair of coils 118, one section thereof being shown, with windings perpendicular to the vertical arm 107, which coils are supplied with different currents, so that the coil combined with the magnet 111 is supplied with a current different from that supplied to the coil combined with the magnet 112, so that the magnetic moment associated with the magnet 111 is higher than the magnetic moment associated with the magnet 112. Such current differentiation causes a difference in the magnetization of the permanent magnets and hence perturbates the magnetic field, thereby creating an offset between the imaging volume center S and the geometric center O of the geometric shape delimited by the cavity.

Figure 7A:
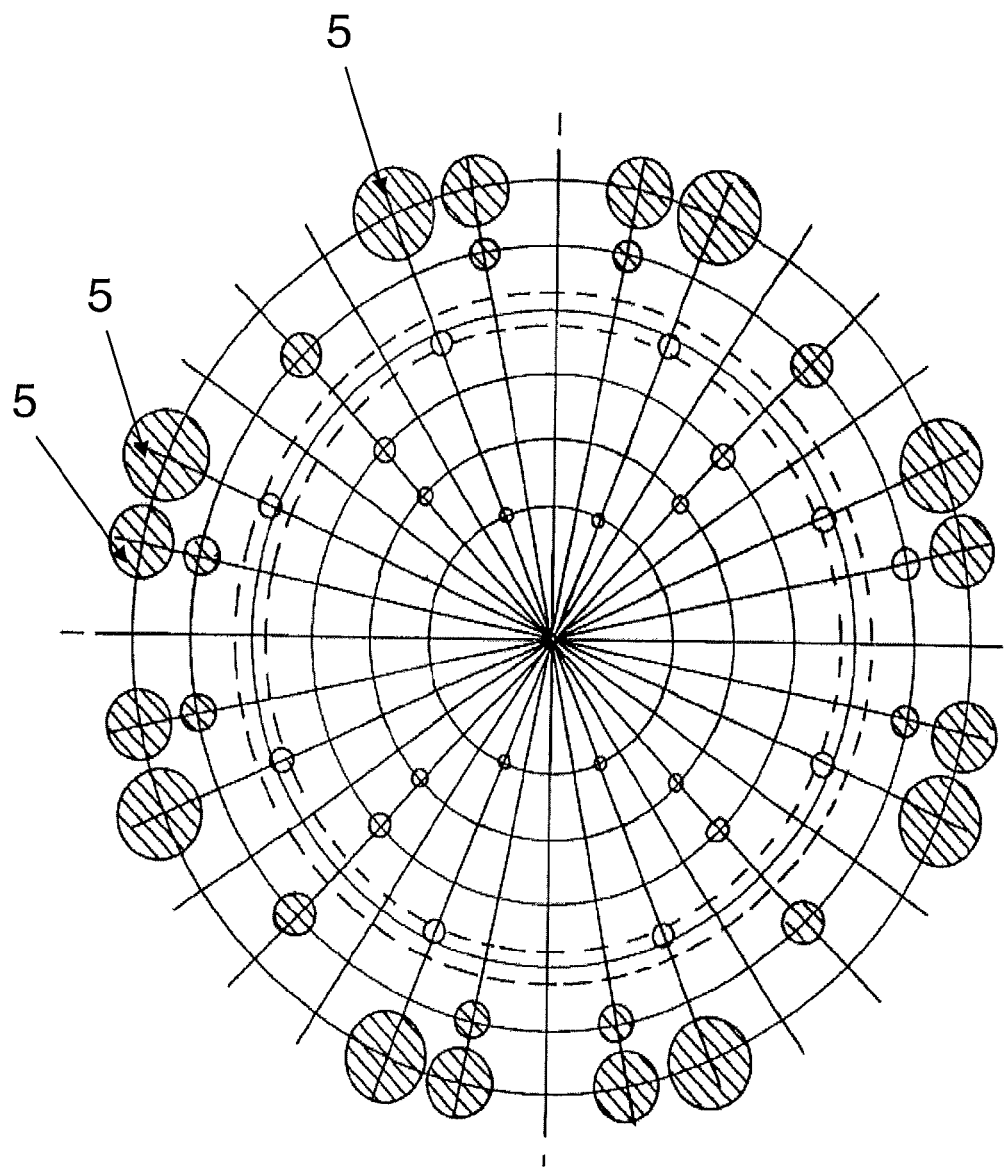
FIGS. 7a and 7b show two possible embodiments of the means for fine adjustment of magnetic field homogeneity.

FIG. 7a is a view of the means for fine adjustment of magnetic field homogeneity for carrying out the process known as shimming in a variant embodiment in which such fine adjustment means consist of magnetic dipoles 5 held within a locating and fixing plate, which is situated at least at one of the two magnetic pole pieces at the two opposite sides of the cavity. Particularly, these dipoles 5 are arranged over an ideal locating grid, which consists of a series of concentric rings and an array of radiuses intersecting them. This will define a grid of positions in angular and radial coordinates, whose mathematical description, when related to the mathematical description of the magnetic field, allows the generation of a system of equations, that can be used to determine the position on the grid, the magnetization arrangement of the magnetic dipoles that form the adjusting elements 5.

Upon determination of the offset between the imaging volume center and the geometric center of the geometric shape delimited by the cavity, caused by the different magnetization of the magnetic field flux returning elements, the homogeneity of the magnetic field may be corrected by a shimming session, as is known in the art and/or particularly as disclosed in patent EP 1748300, by the applicant hereof.

Figure 7B:
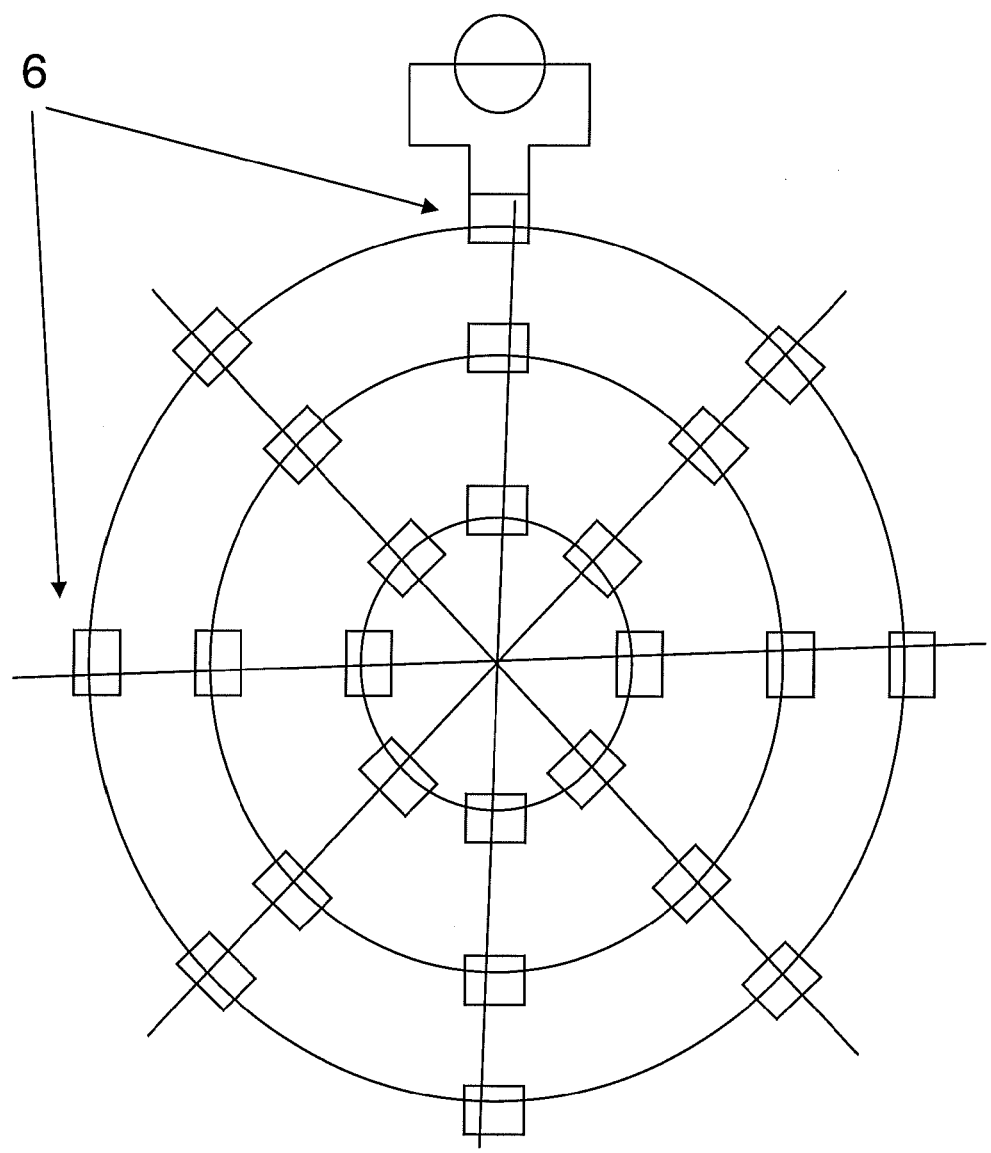

FIG. 7b shows a variant embodiment of the MRI apparatus, in which the means for fine adjustment of magnetic field homogeneity consist of a matrix of coils 6 supplied with supply currents, instead of the dipoles as described above. Once again, the coils 6 are arranged over an ideal locating grid, which consists of a series of concentric rings and an array of radiuses intersecting them.

While the figure shows an exemplary grid, with a limited number of coils 6, and a given number a given distance of circles and lines, it should be understood that any number of circles may be provided, according to the homogeneity aberrations that are known by experience to be systematic.

Furthermore, each coil 6 is powered separately from the others, with the supply currents being determined by the known algorithms of prior art shimming methods, which algorithms are possibly replaced by and/or combined with magnetic field measuring means.

Currents may be determined empirically, by measuring field homogeneity and progressively increasing coil currents until homogeneity characteristics are achieved, within given tolerances.

It shall be further noted that while FIG. 7b shows a single coil connected to a power source, each coil has to be intended to be connected to a power source using, for instance, a multichannel power supply for separately powering each coil 6, according to the algorithms of prior art shimming methods.

According to an improvement of the present invention, the matrix of coils may be in the form of an electronic printed circuit board, where the coils are the tracks of the circuit, and are individually connected to multiple power sources.

The invention claimed is:

1. An MRI apparatus comprising:
    a magnet structure which delimits a cavity for receiving a body under examination or a part thereof, said magnet structure including means for generating a magnetic field in said cavity, means for causing the body under examination or the part thereof to emit nuclear magnetic resonance signals, a region of space defined within said cavity as an imaging volume, and means for receiving said nuclear magnetic resonance signals; and
    an electronic processing unit with which said means for receiving the nuclear magnetic resonance signals are electrically connected;
    wherein the geometric center of the cavity delimited by the magnet structure is in offset relation to the geometric center of the imaging volume; and
    wherein said magnetic field generating means include at least two opposing magnetic pole pieces located at two opposite sides of the cavity, said magnetic pole pieces comprising at least one layer of magnetized material to generate a magnetic field oriented from one to the other of said two magnetic pole pieces, magnetic field flux returning means being provided at the two opposite sides of a section plane of the cavity which is oriented transverse, said at least two returning elements being magnetized with different magnetizations, to thereby generate an offset of the geometric center of the imaging volume with respect to the geometric center of the geometric shape of the cavity delimited by said magnet structure.

2. An apparatus as claimed in claim 1, wherein the cavity has at least one opening through which a body under examination or a part of said body may access said cavity;
    said imaging volume being a region of the interior space of said cavity, whose volume is smaller than the overall cavity volume;
    wherein, in said imaging volume, the static magnetic field generated by the magnet structure has a predetermined homogeneity, said imaging volume being also ideally delimited by a three-dimensional surface within which the static magnetic field has said predetermined homogeneity; and
    wherein the geometric center of the geometric shape of the cavity delimited by said magnet structure is offset in relation to the geometric center of the imaging volume.

3. An MRI apparatus as claimed in claim 2, wherein the geometric center of the geometric shape of the cavity delimited by said magnet structure is in offset relation to the geometric center of the geometric shape of the ideal imaging volume delimiting surface.

4. An MRI apparatus as claimed in claim 2, wherein the point of the imaging volume in which the magnetic field gradient is zero is offset to the geometric center of the geometric shape of the cavity delimited by said magnet structure.

5. An MRI apparatus as claimed in claim 1, wherein the offset is provided by an asymmetry of the magnetic field generated by said magnetic field generating means, which has the same direction as said offset.

6. An MRI apparatus as claimed in claim 1, wherein said two pole pieces are arranged in vertically aligned relation, as upper and lower pole pieces, patient support means being associated with the lower pole piece, which means are disposed eccentrically to the center-to-center axis of the pole pieces.

7. An MRI apparatus as claimed in claim 6, wherein the offset of the imaging volume center to the geometric center of the geometric shape of the cavity delimited by said magnet structure is generated in the direction of and at a predetermined distance from the lower pole piece.

8. An MRI apparatus as claimed in claim 1,
    wherein said at least two magnetic field flux returning elements include magnetization adjustment means for adjusting the magnetization of said returning elements, to control the offset of the center of the imaging volume to the geometric center of the geometric shape of the cavity delimited by said magnet structure.

9. An MRI apparatus as claimed in claim 8, wherein said magnetization adjustment means are variable magnets, preferably electromagnets or superconducting magnets.

10. An MRI apparatus as claimed in claim 8, wherein said magnetization adjustment means are means for controlling temperature within said magnetic field flux returning elements.

11. An MRI apparatus as claimed in claim 8, wherein the distance of the center of the imaging volume from the geometric center of the geometric shape of the cavity delimited by said magnet structure depends on the type of body under examination, or part thereof, to be analyzed and/or on the type of examination and/or on image characteristics, said distance being controlled by said magnetization adjustment means.

12. An MRI apparatus as claimed in claim 1, wherein said magnet structure has a C shape, with two horizontal arms and one vertical arm, said two horizontal arms being formed of said magnetic pole pieces, and the vertical arm being formed of said at least two magnetic field flux returning elements.

13. An MRI apparatus as claimed in claim 1, wherein said magnet structure has a closed annular shape, with two horizontal or vertical arms carrying the magnetic pole pieces, which are connected at their opposite ends by transverse arms, that are formed of at least one pair of magnetic field flux returning elements.

14. An MRI apparatus as claimed in claim 1, wherein said magnet structure has no ferromagnetic yoke.

15. An MRI apparatus as claimed in claim 1, wherein said magnet structure is composed of magnetized elements in the form of uniformly magnetized prisms.

16. An MRI apparatus comprising:
- a magnet structure which delimits a cavity for receiving a body under examination or a part thereof, said magnet structure including means for generating a magnetic field in said cavity, means for causing the body under examination or the part thereof to emit nuclear magnetic resonance signals, a region of space defined within said cavity as an imaging volume, and means for receiving said nuclear magnetic resonance signals;
- an electronic processing unit with which said means for receiving the nuclear magnetic resonance signals are electrically connected; and
- magnetization adjustment means including at least one pair of coils,
- wherein the at least two coils are supplied with different currents, and the position of the imaging volume center is offset from the geometric center of the geometric shape delimited by the cavity by means of a differentiated power supply to said two coils; and
- wherein the geometric center of the cavity delimited by the magnet structure is offset in relation to the geometric center of the imaging volume.

* * * * *